(12) United States Patent
Kinyua et al.

(10) Patent No.: US 8,305,246 B2
(45) Date of Patent: Nov. 6, 2012

(54) AMPLIFIER WITH DIGITAL INPUT AND DIGITAL PWM CONTROL LOOP

(75) Inventors: Martin Kinyua, Austin, TX (US); Eric Soenen, Austin, TX (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 112 days.

(21) Appl. No.: 12/892,487

(22) Filed: Sep. 28, 2010

(65) Prior Publication Data

US 2011/0102223 A1  May 5, 2011

Related U.S. Application Data

(60) Provisional application No. 61/258,435, filed on Nov. 5, 2009.

(51) Int. Cl.
*H03M 3/02* (2006.01)
(52) U.S. Cl. .......................................... 341/143; 341/150
(58) Field of Classification Search .................. 341/143, 341/150
See application file for complete search history.

(56) References Cited

U.S. PATENT DOCUMENTS

| | | | |
|---|---|---|---|
| 4,947,171 A * | 8/1990 | Pfeifer et al. | 341/143 |
| 6,177,897 B1 * | 1/2001 | Williams, III | 341/150 |
| 6,646,502 B1 | 11/2003 | Kruiskamp | |
| 6,897,725 B2 | 5/2005 | Honda | |
| 7,612,608 B2 * | 11/2009 | Kozak et al. | 330/251 |
| 2003/0122692 A1 * | 7/2003 | Roeckner et al. | 341/143 |
| 2008/0042746 A1 * | 2/2008 | Kozak et al. | 330/251 |
| 2009/0315623 A1 * | 12/2009 | Dooper et al. | 330/251 |
| 2011/0248779 A1 * | 10/2011 | Oddoart et al. | 330/207 A |

OTHER PUBLICATIONS

Forejit, Brett et al., "A 700+-mW Class D Design With Direct Battery Hookup in a 90-nm Process", IEEE Journal of Solid-State Circuits, Vo. 40, No. 9, Sep. 2005, pp. 1880-1887.
Ramaswamy, Srinath, et al., "A High-Performance Digital-Input Class-D Amplifier with Direct Battery Connection in a 90nm Digital CMOS Process", ISSCC 2008, Session 24, Analog Power Techniques, 24.2.

* cited by examiner

*Primary Examiner* — Howard Williams
(74) *Attorney, Agent, or Firm* — Lowe Hauptman Ham & Berner, LLP

(57) ABSTRACT

A class D amplifier is configured to accept a digital input signal wherein the control loop of the class D amplifier employs a hybrid filter merged with the front-end of a sigma-delta ADC converter. The term hybrid refers to the filter using both digital and analog components in which the digital delay elements serve as shift registers while the filter coefficients are analog. The filter converts the digital PDM data into a step-wise sinusoidal signal. The sigma-delta ADC receiving a feedback signal subtracts the step-wise sinusoidal signal from the continuous sinusoidal signal and converts the result to a digital PDM signal, without decimation, which passes through a digital filter, a PWM generator, and a pre-driver, to provide power to the load.

29 Claims, 9 Drawing Sheets

$$OUT(z) = \frac{H(z).z^{-N}}{1+H(z).B(z).z^{-N}} In(z) + \frac{H(z).(1-z^{-1})^N}{1+H(z).B(z).z^{-N}} q(z) + \frac{1}{1+H(z).B(z).z^{-N}} P(z)$$

$$H(z) = a_1 z^{-1} + a_2 z^{-2} + \ldots a_n z^{-n}$$

$$H(s) = \frac{s+z_1}{s+p_1} * G_1 \qquad B(s) = \frac{1}{s+p_2} * G_2$$

FIG. 9

AMPLIFIER WITH DIGITAL INPUT AND DIGITAL PWM CONTROL LOOP

CROSS-REFERENCE TO RELATED APPLICATIONS

The present application claims priority of U.S. Provisional Patent Application Ser. No. 61/258,435 filed on Nov. 5, 2009 which is incorporated herein by reference in its entirety.

TECHNICAL FIELD

The present disclosure is generally related to power amplification using PWM (Pulse Width Modulator) switching technology. Various embodiments employ digital input class D amplifier with a digital PWM control loop.

BACKGROUND

The fundamental principal of power amplification using switching technologies has been referred to as class-D, switching power amplification, digital power amplification or PWM power amplification. Class D amplifiers, in contrast to class A, class B, or class AB amplifiers, use the switching modes of transistors to regulate power delivery. The amplifiers, therefore, attain high power efficiency (i.e., low energy loss). Analog-input class-D amplifiers, however, require high precision analog components and generally require complicated analog control loops that are difficult to design. For example, an analog integrator in an approach requires a high gain amplifier, analog circuits with high swing, and high input-output linearity. The ramp generator in the same approach is difficult to design, parasitic prone, and also requires large swing of the output. Another approach only accepts analog inputs, requires a test signal to measure the frequency characteristic of the control loop. The control loop of another approach does not have high gain, and, as a result, cannot achieve high linearity. Some approaches may require complex $2^{nd}$ order loops and filters, and quite a number of amplifiers, comparators, etc.

Digital input class-D amplifiers generally require a high precision DAC to convert digital data to analog. An approach uses complicated high-gain amplifiers and analog comparators, and also faces analog control loop instabilities.

BRIEF DESCRIPTION OF THE DRAWINGS

The details of one or more embodiments of the invention are set forth in the accompanying drawings and the description below. Other features and advantages of embodiments of the invention will be apparent from the description, drawings, and claims.

FIG. 7 shows the z-domain mathematical equations that relate the input In(z), the quantization error q(z) of the delta-sigma ADC, the quantization error P(z) of the PWM generator with the transfer function of the filters H(z) and B(z), in accordance with an embodiment.

FIG. 8 shows the transfer function of the digital filter of FIG. 1, in accordance with an embodiment.

FIG. 9 shows the transfer function of the filters H(s) and B(s) in the continuous time or s domain.

Like reference symbols in the various drawings indicate like elements.

DETAILED DESCRIPTION

Figure 1:
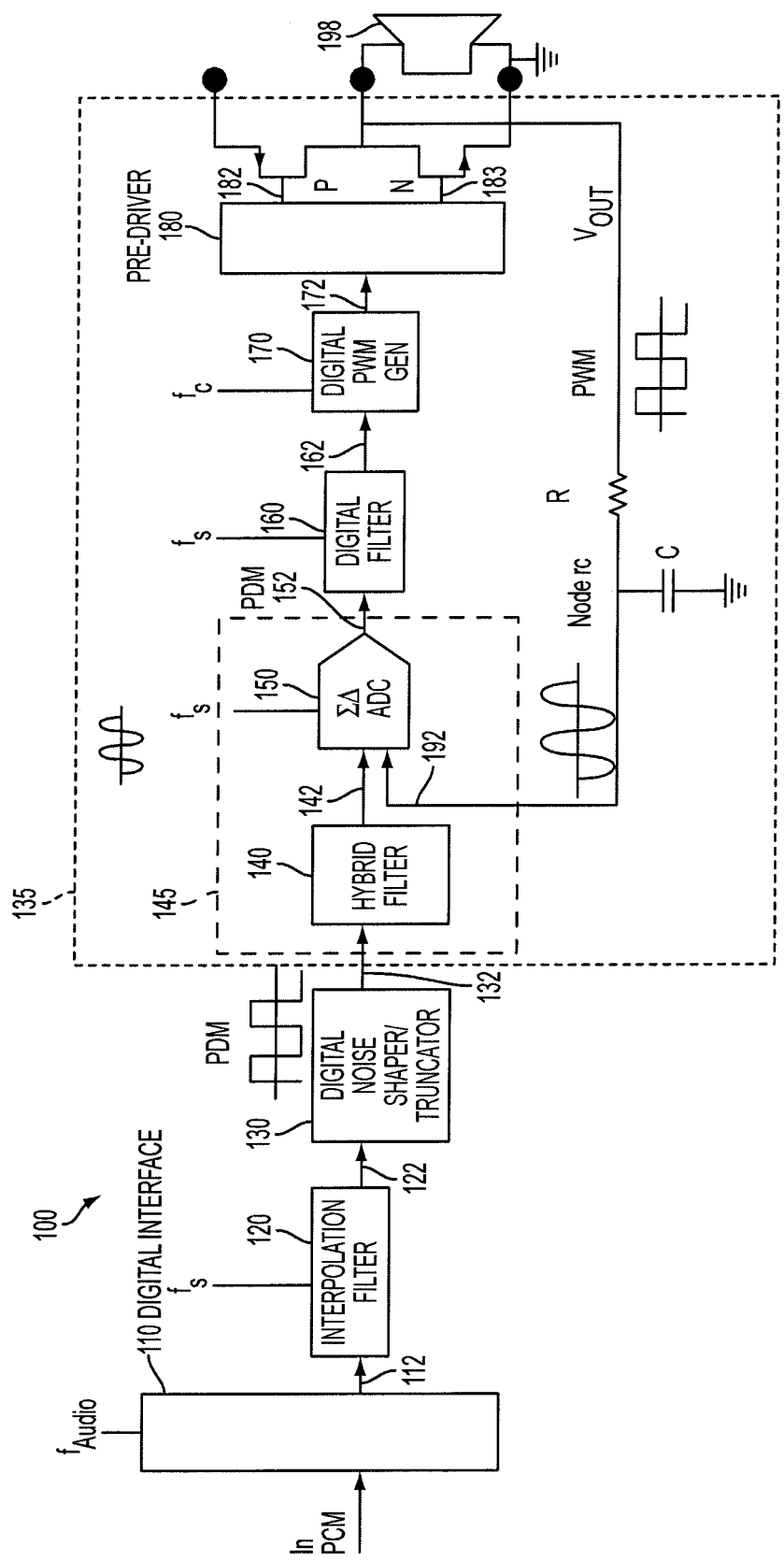
FIG. 1 shows an exemplary class D amplifier in accordance with an embodiment.

Various embodiments, or examples, of the disclosure illustrated in the drawings are described below using specific language. It will nevertheless be understood that no limitation of the scope of the invention is thereby intended. Any alterations and modifications in the described embodiments, and any further applications of principles of the invention described in this document are contemplated as would normally occur to one of ordinary skill in the art to which the invention relates. Reference numbers may be repeated throughout the embodiments, but this does not necessarily require that feature(s) of one embodiment apply to another embodiment, even if they share the same reference number.

Exemplary Amplifier

FIG. 1 shows an exemplary class D amplifier 100, in accordance with an embodiment.

Digital interface 110 receives input In the form of a PCM (pulse code modulation). In an embodiment, input In complies with the digital input for class D amplifiers, and include audio data. Those skilled in the art will recognize that audio data operates in the 20 Hz-20 kHz range. Other data and data format are within the scope of various embodiments of the disclosure, including, for example, SPDIF (Sony Philips Digital InterFace), format, etc. $F_{audio}$ represents frequency for audio inputs.

Interpolation filter 120 interpolates data 112 to a higher frequency, which, for example, by a factor of 128, 256, 512, etc., to provide data 122. Frequency fs provides the sampling rate for interpolation filter 120 (and for ADC 150, digital filter 160, etc.).

Digital noise shaper 130 pushes most of the noise of data 122 to the higher frequencies, resulting in data 132. In various embodiments of the invention, data 132 has been truncated to a lower number of bits and in the form of PDM (pulse density modulation). Depending on application, data 132 may include a 1-bit code.

Control loop or control circuit 135 provides a close loop system and detects the error signal, which is the difference between signal 142 and 192, passing through sigma delta ADC 150, digital filter 160, digital PWM generator 170, etc. Control circuit 135 converts PDM data 132 into analog (e.g., data 142), encodes the difference information with feedback signal 192, to drive the switching stage that drives the load (e.g., speaker) 198. Control circuit 135 controls (e.g., turn on/off) transistors P and N in an alternating manner to drive load 198. In the embodiment of FIG. 1, control circuit 135 uses PWM data (e.g., data originated from data 172) to control load 198. Various embodiments of the disclosure, via circuit 145 that includes hybrid filter 140 and sigma delta ADC 150, provide a highly efficient mechanism to deliver power to speaker 198 without using high precision components as required by other approaches.

Circuit block 145 converts PDM signal 132 to PDM signal 152, taking accounts of signal from voltage Vout going through the feedback loop comprising the RC low pass filter (e.g., including resistor R and capacitor C). Hybrid filter 140 may be referred to as a digital-to-analog interface that includes N-taps. Hybrid filter 140 converts PDM signal 132 to a sinusoidal step signal 142 from which a continuous waveform signal (e.g., signal 192) may be subtracted. The term "hybrid" refers to the fact that the delay elements serving as shift registers are digital while the filter coefficients are analog. In the embodiment where data 132 includes a 1-bit code and data 142 includes a multi-level, continuous time signal, hybrid filter 140, in effect, converts the single-bit serial input into a multi-step output. Hybrid filter 140 efficiently interfaces incoming digital data 132 to the PWM control loop 135 as hybrid filter 140 does not use complicated analog components like other approaches. Depending on applications, hybrid filter 140 may be considered as being merged with the front-end of sigma-delta ADC 150.

Sigma-delta ADC (or sigma-delta modulator) 150 receives as inputs signal 142 and signal 192, compares these two signals and converts the difference between them to PDM signal 152. In effect, sigma-delta ADC 150 converts signals from analog (e.g., output of hybrid filter 140 and the feedback signal) to digital (e.g., PDM signal 152). Sigma-delta ADC 150 also pushes quantization noise out to the high frequency band thereby providing efficient distribution in the band of interest. FIG. 1 shows a single-ended hybrid filter 140 and a single-ended sigma-delta ADC 150, but various embodiments of the disclosure are applicable to differential hybrid filters and sigma-delta ADCs, which are illustrated in detail in FIG. 2 below.

Digital filter 160 serves to complement and better control the loop (e.g., loop 135) frequency response and its transfer function. Digital filter 160 provides the high gain while maintaining loop stability. Depending on applications, the frequency response of digital filter 160 may be matched to other analog components (e.g., the RC low pass filter). Signal 162, output of digital filter 160, is close to a PDM signal as it has been filtered from a PDM signal. In various embodiments of the invention, output 152 of delta-sigma 150 is coupled directly to digital filter 160, without the need for a decimation filter that is typically used to reduce the sample rate of signal 152. The absence of a decimation filter is advantageous in making control loop 135 more robust.

Digital PWM generator 170 converts data 162 to data 172 having pulse width modulated information (e.g., PWM) to drive the switching stage comprising transistors P and N. Frequency fc is the PWM carrier switching frequency.

Pre-driver 180 amplifies data 172 and in conjunction with PWM generator 170 sends pulses to control transistors P and N in order to drive load 198. FIG. 1 shows one pre-driver 180 for illustration, but additional pre-drivers 180 may be used.

Transistors P and N are connected in series having their gates receiving data 182 and 183, respectively. Transistors P and N may be referred to as the switching circuit or stage.

Exemplary speaker 198 serves as the load for circuit 100, and functions based on the received PWM data. Depending on applications, a low pass filter may be provided at the two nodes of speakers 198.

Resistor R and capacitor C form a low pass filter (e.g., an RC low pass filter) converting signal Vout in the form of PWM to an analog (e.g., continuous sinusoidal) signal. Feedback loop including this RC low pass filter provides signal Vout to sigma-delta ADC 150 in the form of signal 192.

Differential Hybrid Filter And Sigma Delta ADC

Figure 2:
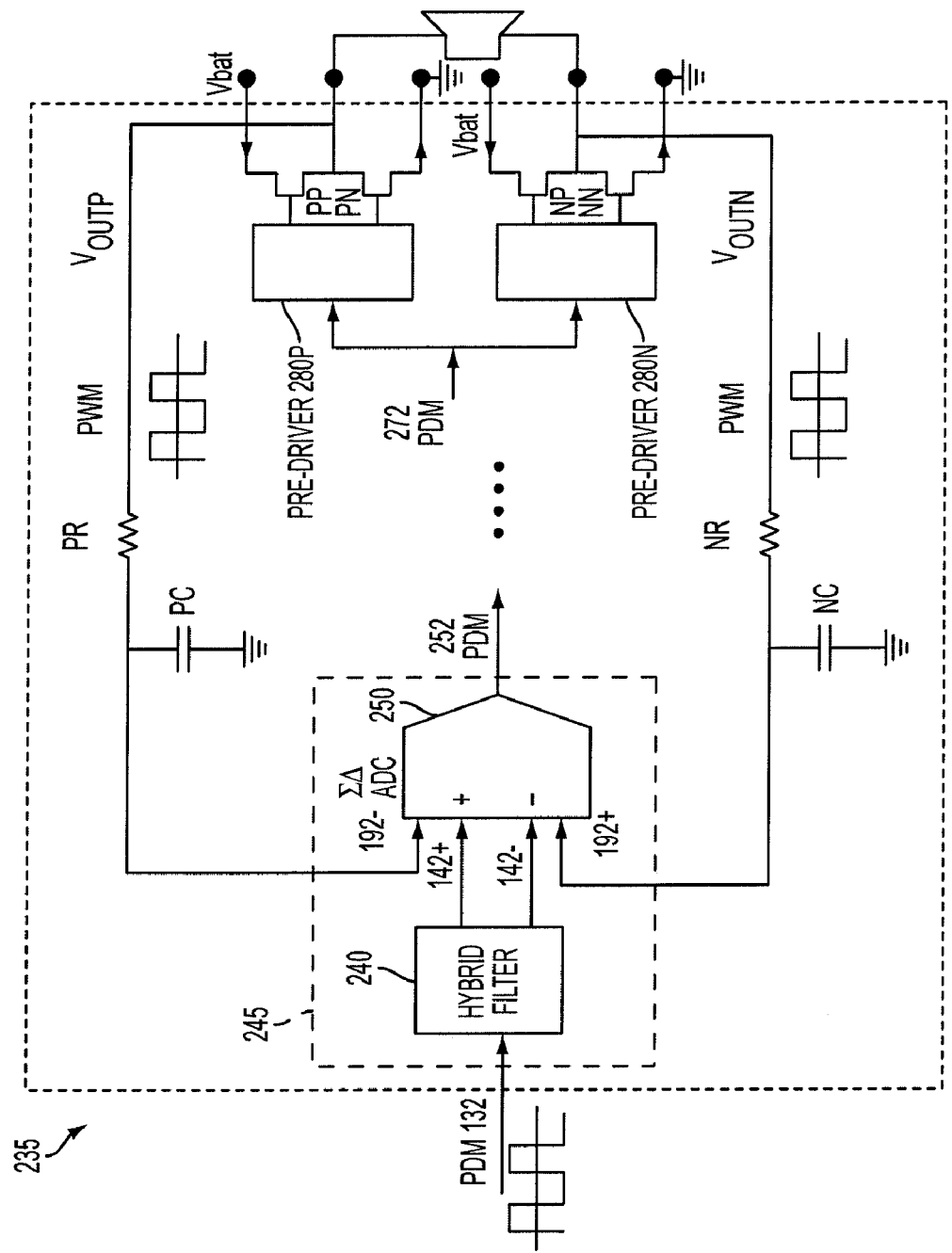
FIG. 2 shows a feedback loop of FIG. 1 wherein the hybrid filter and the sigma delta are fully differential, in accordance with an embodiment.

FIG. 2 shows a loop 235 being an embodiment of loop 135 that utilizes a differential hybrid filter 240 and a differential sigma-delta ADC 250. In the embodiment of FIG. 2, differential hybrid filter 240 provides a positive signal 142+ and a negative signal 142− being a differential signal of signal 142. Sigma-delta ADC 250 amplifies the difference between signal 142+ and signal 142−. Similarly, sigma delta ADC 250 also receives a positive signal 192+ and a negative signal 192−. As compared to FIG. 1, signal 192+ is comparable to signal 192 and FIG. 2 includes additional circuitry to provide signal 192−. For example, pre-driver 280N, the pair of transistor NP, NN, and voltage Voutn provide the feedback loop including resistor NR and capacitor NC to result in signal 192+, which are similar to pre-driver 180, the pair of transistors P, N, voltage Vout, resistor R, capacitor C and voltage 192 shown in FIG. 1. Pre-driver 280P, the pair of transistors PP, PN, voltage Voutp, resistor PR and capacitor PC provide the feedback loop to result in signal 192−. Signal 192− is 180 degree out of phase as compared to signal 192+. Sigma delta 250 provides PDM signal 252 corresponding to PDM signal 152. Pre-drivers 280P and 280N receive as input PDM signal 272 corresponding to PDM signal 172. In an embodiment, a single capacitor (e.g., capacitor NPC, not shown) is used for both capacitors NC and PC connected differentially across the two differential feedback paths.

Loop 235 also includes digital filter 260 corresponding to digital 160, digital PWM generator 270 corresponding to digital PWM generator 170, but for simplicity, filter 260 and generator 270 are not shown.

Hybrid Filter

Figure 3:
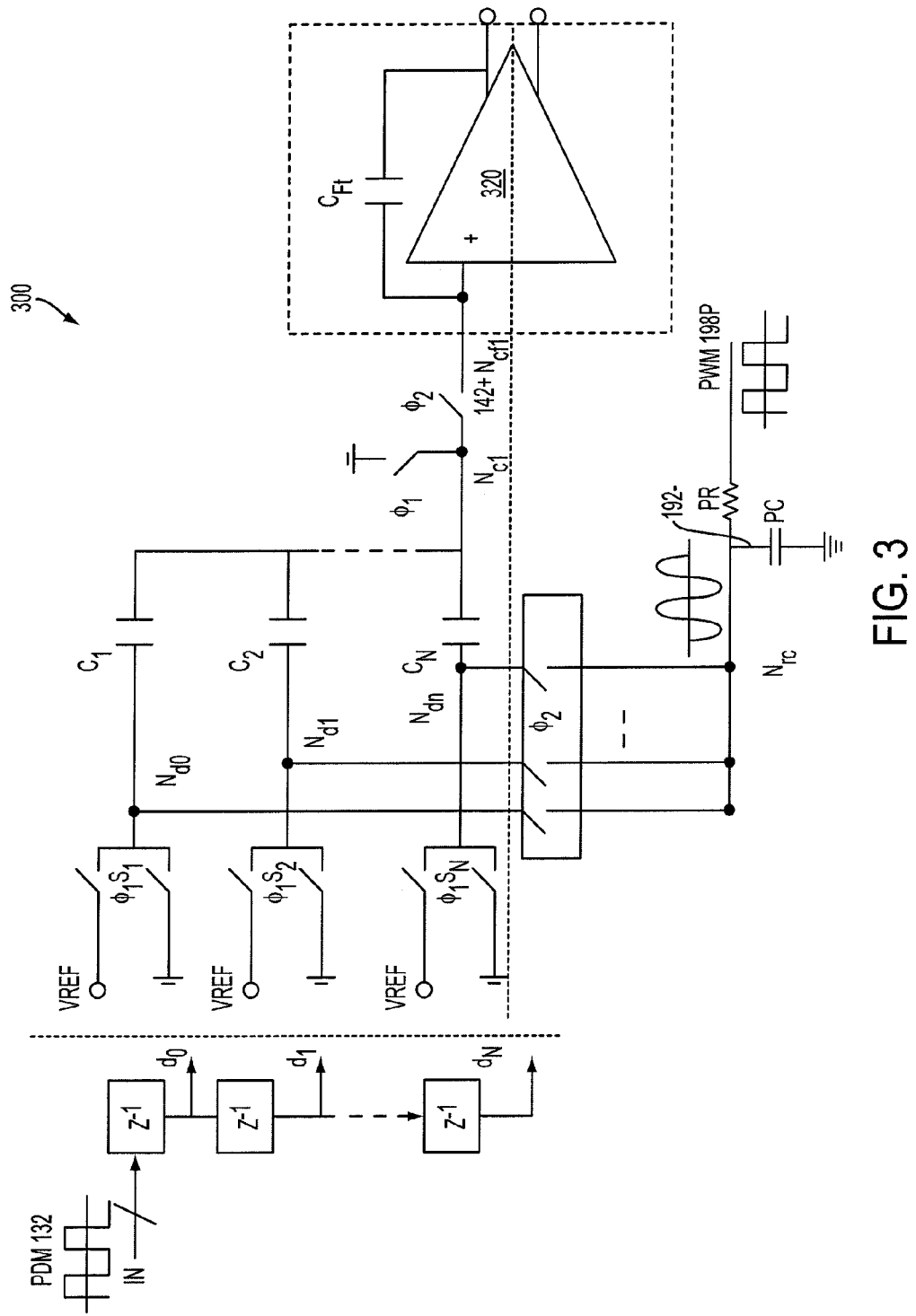
FIG. 3 shows a circuit illustrating a first part of the hybrid filter in FIG. 2, in accordance with an embodiment.

FIG. 3 shows a circuit 300 being part of hybrid filter 240, in accordance with an embodiment. Circuit 300 provides signal 142+being coupled to the positive input of sigma-delta ADC 250.

Signal 132 encoded in the PDM format (e.g., bit stream) controls the charge acquired by the capacitor array including capacitors C1 to CN. PDM signal 132 passes through a series of delays (i.e., delays $z^{-1}$) that are digital in nature. Digitally delayed inputs d (e.g., inputs $d_0$ to $d_N$) control the corresponding switches S1 to SN. If a delay input d (e.g., input d0) is high then the corresponding switch (e.g., switch S1) is closed so that the corresponding node Nd (e.g., node Nd0) is connected to voltage Vref, which charges the corresponding capacitor (e.g. capacitor C1) to voltage Vref. If the same delay input d (e.g., input d0) is low then the corresponding switch (e.g., switch S1) is closed such that node N (e.g., node Nd0) is connected to ground, which allows the corresponding capacitor (e.g., capacitor C1) to be discharged to ground.

Delay inputs d function as shift registers, e.g., being cascaded in a chain of delays, and each input d is delayed by a clock represented by $Z^{-1}$. Capacitors C1 to CN represent the order of hybrid filter 240. At an active edge of the clock (e.g., a falling or rising edge, depending on applications), a capacitor C (e.g., C1, C2, . . . , CN) receives new information from input data stream PDM 132 or information from the previous capacitor C in the capacitor chain. Alternatively expressed, information stored by a capacitor C is shifted (e.g., down) to the next capacitor C in the chain. For example, information from PDM input signal 132 is shifted to node Nd0 of capacitor C1; information stored by capacitor C1 at node Nd0 is shifted to node Nd1 of capacitor C2; information stored by capacitor C2 at node Nd1 is shifted to node Nd2 of capacitor C3; information stored by capacitor C3 at node Nd2 is shifted to node Nd3 of capacitor C4, etc. In effect, switches S and capacitors C1 to CN implement a low pass filter filtering PDM signal 132 resulting in signal 142+.

Circuit 300 works in two phases represented by symbol $\phi_1$ and $\phi_2$. As illustrated in FIG. 3, node Nc1 is connected to ground during phase $\phi_1$ and is connected to node Ncf1 during phase $\phi_2$. As a result, during phase $\phi_1$ one end of capacitors C1 to CN (e.g., nodes Nd0, Nd1, Nd2, etc.) is charged to voltage Vref or discharged to ground depending on the corresponding value of input d as explained above, and the other ends of capacitors C1 to CN being coupled to node Nc1 that is connected to ground.

During phase $\phi_2$ the same end of capacitors C1 to CN (e.g., nodes Nd0, Nd1, Nd2, etc.) that are charged to Vref or discharged to ground are connected to the low pass filter comprising resistor PR and capacitor PC having signal 192− causing a subtraction of signal 192− from signal 142+. Amplifier 320 represents a stage of sigma-delta ADC 250, which will be illustrated below with reference to FIG. 5.

Resistor PR and capacitor PC form a low pass filter filtering feedback signal PWM 198P to a continuous (e.g., sinusoidal) signal 192−, which when appropriate is subtracted from signal 142+.

Figure 4:
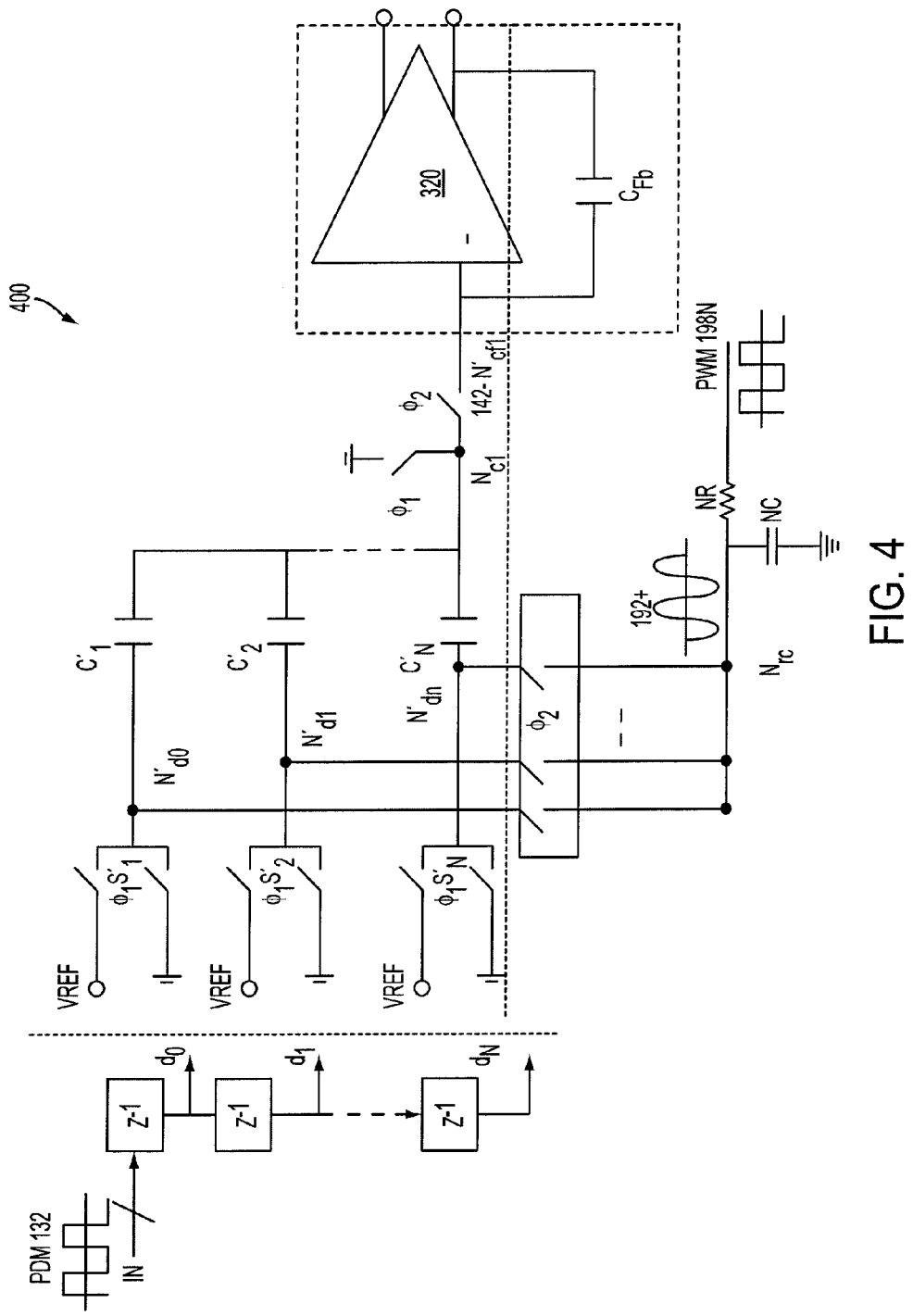
FIG. 4 shows a circuit illustrating a second part of the hybrid filter in FIG. 2, in accordance with an embodiment.

FIG. 4 shows a circuit 400 of hybrid filter 240, in accordance with an embodiment. Circuit 400 provides signal 142− and is coupled to the negative input of sigma-delta ADC 250. As compared to circuit 300, circuit 400 includes capacitors C1' to CN' corresponding to capacitors C1 to CN, switches S1' to SN' corresponding to switches S1 to SN, nodes N'd0 to N'dn corresponding to nodes Nd0 to Ndn. These nodes N'd0 to N'dn, however, include the opposite polarity of nodes Ndo to Ndn. For example, if a node (e.g., node Nd0) is coupled to voltage Vref, then node N'd0 is coupled to ground. Conversely, if node Nd0 is coupled to ground, then node N'd0 is coupled to voltage Vref, etc. In an embodiment, causing the opposite polarity in this FIG. 4 is done by having the opposite of the corresponding delay inputs d0 to do in FIG. 3 control the corresponding switches S1' to SN'. For example, if delay input d0 controls switch S1 then a signal/d0 having the opposite polarity of delay input d0 controls switch S1'. If delay input d1 controls switch S2 then a signal/d1 having the opposite polarity of delay input d1 controls switch S2', and if delay input d2 controls switch S3 then a signal/d2 having the opposite polarity of delay input d2 controls switch S3', etc. The feedback signal 192+ also includes the opposite polarity of that of signal 192−. Capacitor Cfb corresponds to capacitor Cft.

Circuits 300 and 400 together may be referred to as a differential switch capacitor implementing digital-to-analog conversion for hybrid filter 240 providing two opposite out of phase signals (e.g., signal 142+ and 142−). Hybrid filter 240 is distinguished and advantageous over other approaches because it is controlled by delayed versions of the same input signal, e.g., signal PDM 132 via delay elements d. On the contrary, some other approaches include control signals having different bit positions of a binary code that can compromise harmonics of the sinusoidal input because the introduced errors can cause harmonic distortion. Further, hybrid filter 240 is inherently linear because the digital implementation of delay inputs d and $Z^{-1}$ is linear, and even if mismatch between capacitors C1 to CN and/or capacitors C1' to CN' exists, the mismatch does not cause non-linearity in hybrid filter 240.

Sigma Delta ADC

Figure 5:
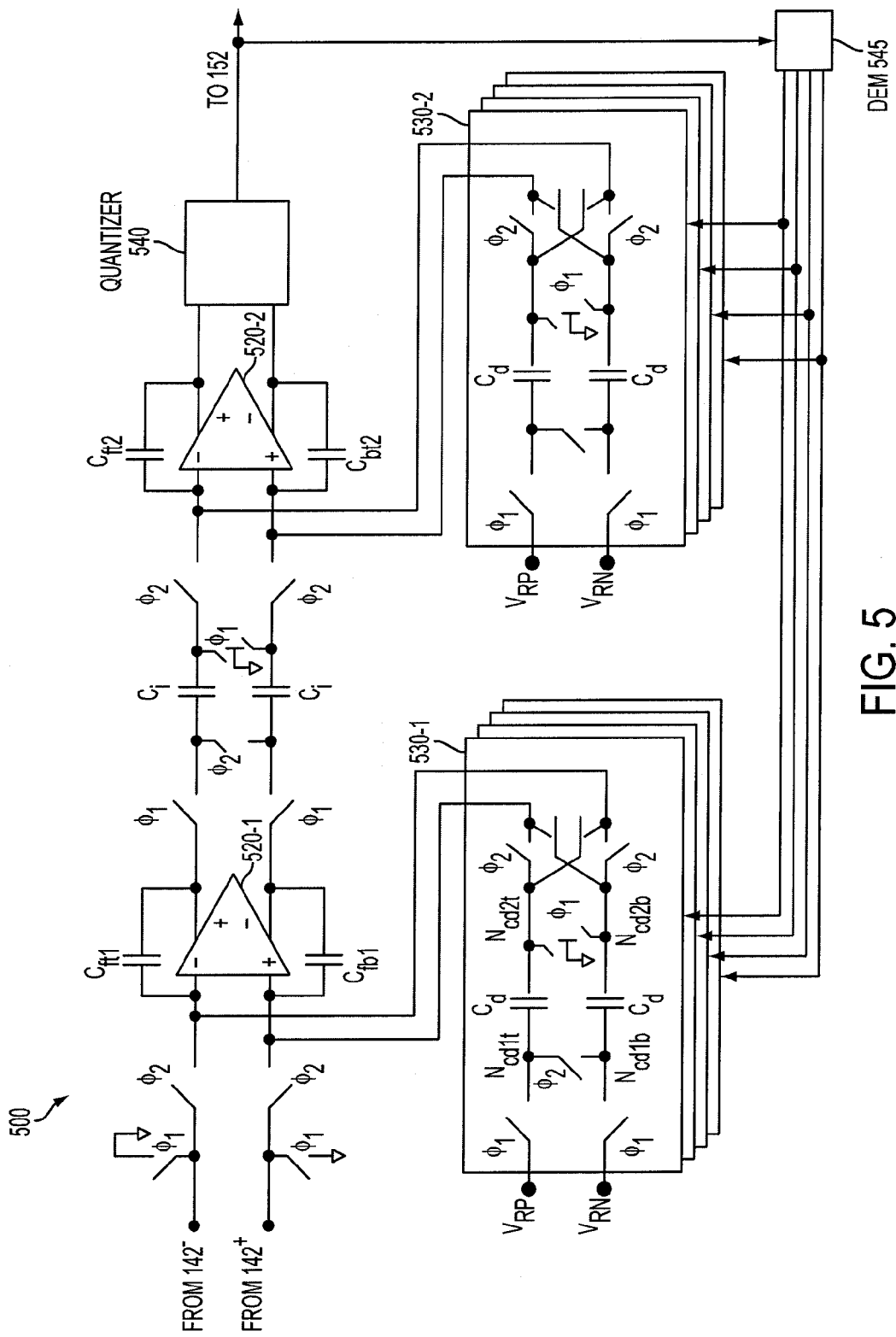
FIG. 5 shows a sigma delta of FIG. 2, in accordance with an embodiment.

FIG. 5 shows a sigma delta ADC 500 illustrating an embodiment of sigma delta ADC 250. Sigma delta ADC 500 functions using switch capacitors implementing charge integration and analog-to-digital conversion. FIG. 5 shows two amplifiers 520-1 and 520-2 illustrating a two-stage sigma delta ADC 500, but embodiments of the disclosure are not so limited, and are applicable to various numbers of stages. Amplifier 520-1 corresponds to amplifier 320 in FIGS. 3 and 4, may be referred to as the first stage, and is used to explain embodiments of the disclosure, but operation of other stages is comparable and is readily recognizable by a person skilled in the art after reading this disclosure.

Circuits 530 (e.g., 530-1, 530-2, etc.) comprise an internal feedback digital-to-analog conversion function that converts the digital output signal 152 of delta sigma 150 back into analog. Voltages Vrp and Vrn define the input range for sigma-delta ADC 500. Similar to hybrid filter 240 including circuits 300 and 400, sigma delta ADC 500 also operates in two phases represented by symbols $\phi_1$ and $\phi_2$. Depending on applications, a circuitry (e.g., an amplifier 520, a circuitry 530, etc.) may perform the same function in a phase $\phi_1$ or phase $\phi_2$ with a temporal delay, and various embodiments of the disclosure are applicable in both delayed and non-delayed scenarios. For simplicity, however, various embodiments of the disclosure are explained in the context without delays.

As shown in FIG. 5, during phase $\phi_1$ one end of capacitors Cd, e.g., nodes Ncd2t and Ncd2b, are grounded and the other end, e.g., nodes Ncd1t and Ncd1b, is coupled to voltage Vrp or voltage Vrn. As a result, depending on the connection, a capacitor Cd is charged to either voltage Vrp or voltage Vrn.

During phase $\phi_2$, the ends of capacitors Cd that are charged either to voltage Vrp or voltage Vrp (e.g., nodes Ncd1t and Ncd1b) are shorted and the other ends of capacitors Cd (e.g., nodes Ncd2t and Ncd2b) are coupled to amplifiers 520. This action, together with the performance and connection with respect to signals 142+ and 142− of hybrid filter 240 as explained above, performs a subtraction and digital-to-analog conversion. A node Ncd2t or Ncd2b may be connected to either a positive or negative terminal of amplifier 520. If node Ncd2t is connected to the positive terminal then node Ncd2b is connected to the negative terminal and vice versa.

Amplifiers 520 (e.g., amplifiers 520-1, 520-2) in conjunction with capacitors Cft (e.g., capacitors Cft1, Cft2) and capacitors Cfb (e.g., capacitors Cfb 1, Cfb2) functions as an integrator including holding information from the previous stage and accumulating charges from one phase to the next phase (e.g., phase $\phi_1$, phase $\phi_2$, phase $\phi_1$ delayed, phase $\phi_2$ delayed, etc.). FIG. 5 shows two amplifiers (or stages) 520-1 and 520-2 with associated circuitry 530-1 and 530-2 for illustration, but various embodiments of the disclosure are applicable to sigma delta ADC 500 having multiple stages 520. Depending on applications, various stages 520 may be implemented as the same (e.g., perform comparable functions) or different (e.g., perform different functions), and a stage may hold information from a previous phase or perform other functions as appropriate. For illustration, stages 520-1 and 520-2 in the embodiment of FIG. 5 perform similar and comparable functions.

Capacitors Cf (e.g., capacitors Cf1t, Cf1b, Cf2t, Cf2b, etc.) may be referred to as integrating capacitors because they accumulate or integrate the charges presented at their nodes at different phases. For example, during phase 2 phase $\phi_2$, integrating capacitors Cf1t, Cf1b, Cf2t, Cf2b accumulate charges from other capacitors C1 to CN, C1' to CN', Cd, and Ci. For an integrator gain of 1, a capacitor Cft1 equals the sum of capacitor C1 to CN. Similarly, a capacitor Cfb1 equals the sum of capacitors C1' to CN'.

During phase $\phi_1$ one end of capacitor Ci is grounded, the other end is coupled to the preceding stage in order to acquire the incoming signal.

Quantizer 540 quantizes information from the last circuit interfacing with quantizer 540. In FIG. 5, quantizer 540 quantizes information stored in phase $\phi_2$ with respect to capacitors Cf2t and Cf2b. But if quantizer 540 interfaces with another amplifier (e.g., amplifier 520-i, not shown) the quantizer 540 quantizes information stored in phase $\phi_2$ with respect to amplifier 520-i and capacitors Cfti (not shown) and Cbti (not shown).

A technique known as Dynamic Element Matching (DEM) 545 provides the digital bits to control where capacitors Cd are connected. As indicated above capacitors Cd may be coupled to either terminal (positive or negative) of amplifiers 520 using these bits during phase $\phi_2$.

In various embodiments, the quantizer resolution of sigma-delta ADC 500 is controlled by capacitors Cd. As a result, the order of the hybrid filter (e.g. filter 240) which is represented by the number of capacitor C1 to CN (or C1' to CN') is independent of the modulator quantizer resolution, which is advantageous because the out-of-band noise suppressed by hybrid filter 240 can be increased by increasing the number of taps (e.g., the number of capacitors C1 to CN) of the hybrid filter 240 independent of the quantizer resolution.

Various embodiments of the invention are advantageous over other approaches because various embodiments can achieve the same result by using switching capacitors without using high precision components and/or complicated analog circuitry/techniques as in those approaches. For example, in an approach that uses a DAC, all DAC elements (e.g., 256 elements for an 8-bit DAC or 512 elements for a 16-bit audio class D amplifier, etc.) must match with high precision, which in turn must be commensurate with the overall precision of the complete circuit (for example, 16-bit), which is not a trivial task to achieve.

Mathematical Equations

Figure 6:
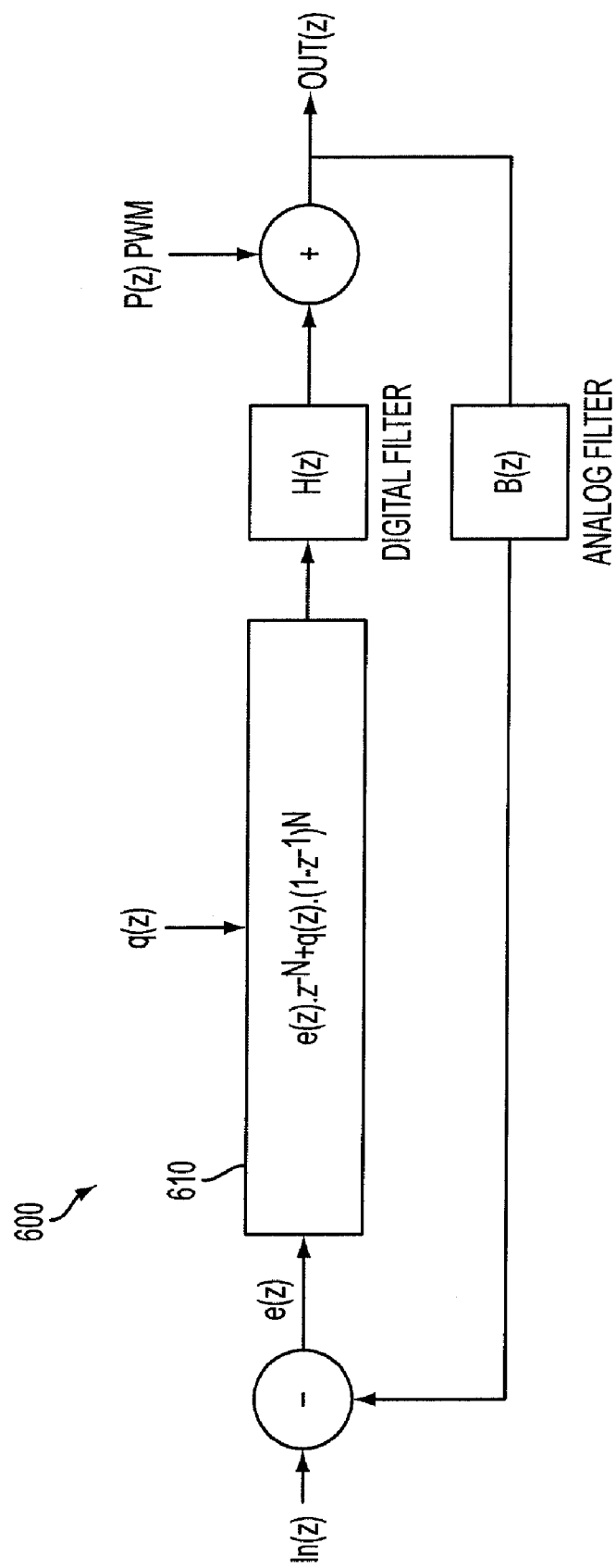
FIG. 6 shows a flow diagram and mathematical equations representing the control loop of FIG. 1, in accordance with an embodiment.

FIG. 6 shows a flow diagram and a linear mathematical model 600 representing loop 135, in accordance with an embodiment.

In(z) is the input signal 132.

e(z) represents the difference between signal 142 and 192 q(z) is the quantization error of the sigma delta ADC 150.

Block 610 mathematically represents the Nth-order sigma delta ADC 150. In the embodiment of FIG. 5, this block 610 would represent the $2^{nd}$ order sigma delta ADC 150.

H(z) is the transfer function corresponding to digital filter 160.

P(z) is the quantization error introduced by the PWM modulation.

B(z) is the transfer function of the low pass filter comprising capacitor C and resistor R.

FIG. 7 shows a mathematical expression 700 for output Out(z), in accordance with an embodiment.

Figure 8:
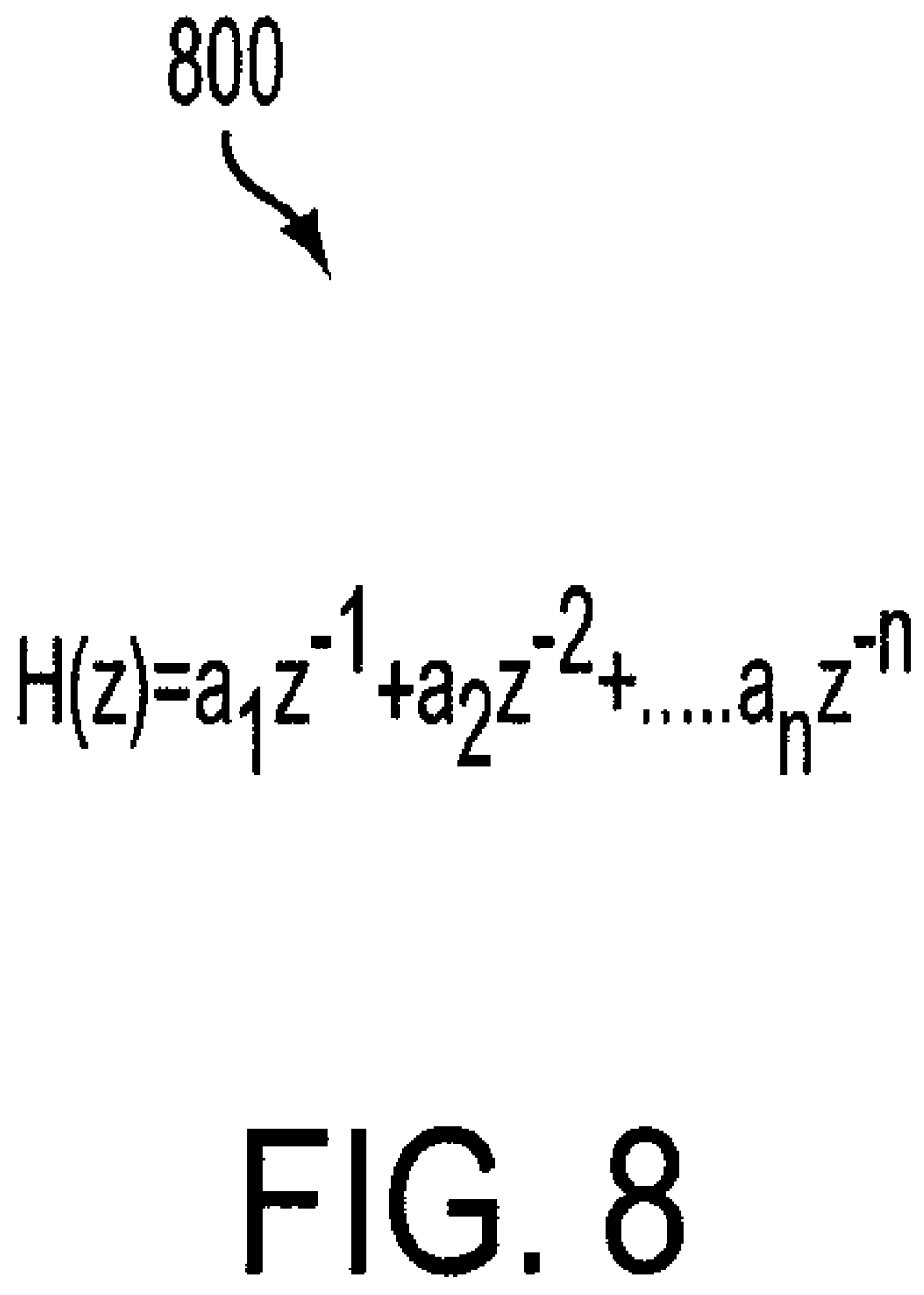

FIG. 8 shows the transfer function of digital filter 160 wherein each parameter a (e.g., a1, a2, . . . , aN) corresponds to analog filter coefficients. The coefficients are implemented using capacitors C (e.g., C1 to CN or C1' to CN') and are represented by the charge stored in the capacitors.

Figure 9:
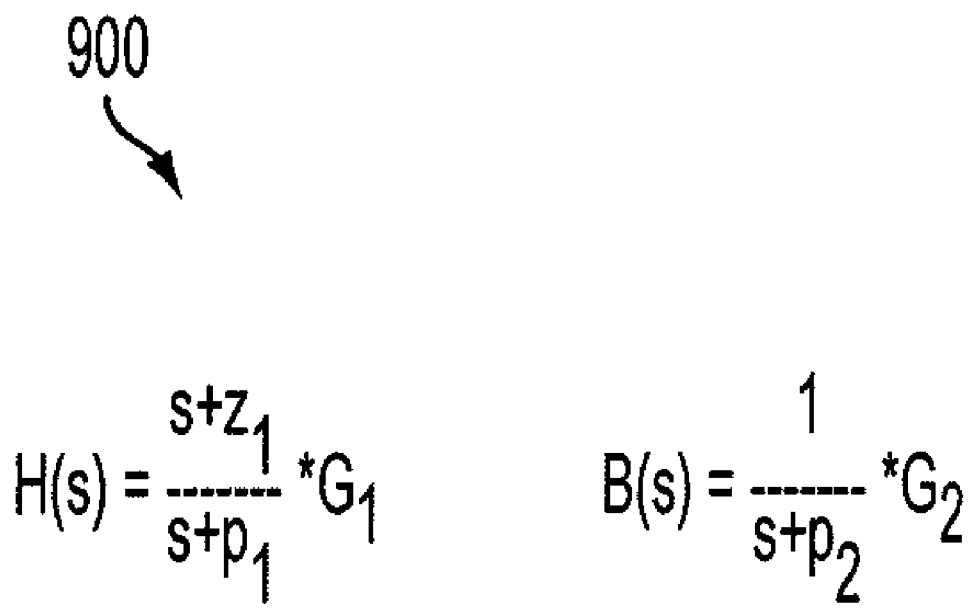

FIG. 9 shows a La Place transform of the transfer functions H(z) and B(z) wherein Z1, P1, G1 are the zero, pole, and gain of transfer function H(S) and P2 and G2 are the pole and gain for transfer function B(s). Various embodiments of the disclosure use the transfer functions (e.g., functions H(s) and B(s)) to achieve a desired loop response, thereby eliminating problems associated with analog loop control experienced by other approaches. For example, in various embodiments appropriately choosing the value of the poles and zeros of the hybrid filter 140 and low pass filter provides a closed loop response with a desired characteristic. For another example, loop 135 is stable based on the following selected parameters:

16 taps (e.g., there are 16 capacitors C1 to C16) for hybrid filter 140

$2^{nd}$ order for sigma-delta ADC 150

5 level of quantization for the quantizer (e.g., quantizer 540)

51.2 MHz for sampling frequency fs

2 KHz for the frequency of pole P1

2 MHz for the frequency of zero Z1

10,000 for gain G1

100 KHz for pole Z2

1 for gain G2 and

800 MHz for PWM switching frequency (e.g., fc)

A number of embodiments of the disclosure have been described. It will nevertheless be understood that various modifications may be made without departing from the spirit and scope of the invention. For example, some embodiments show resistors and/or capacitors, but various embodiments of the disclosure are not so limited, but are applicable to circuitry or devices providing resistance (e.g., resistive devices) and/or capacitance (e.g., capacitive devices) as appropriate. Alternatively, other circuitry may perform the underlying function. For example, one or a combination of active and passive components, including, for example, amplifiers, inductors, switches, may be used to implement a low pass filter, etc.

What is claimed is:

1. A circuit comprising:
a filter configured to convert a first pulse density modulation signal to an analog signal; and
a sigma-delta modulator configured to receive the analog signal and a feedback signal converted from a pulse width modulation output signal, and based on the analog signal and the feedback signal, generate a second pulse density modulation signal.

2. The circuit of claim 1 wherein the feedback signal is subtracted from the analog signal.

3. The circuit of claim 1 wherein the filter includes a plurality of delay elements configured for a plurality of capacitive devices to be charged to a reference voltage or discharged to ground.

4. The circuit of claim 3 wherein the plurality of capacitive devices are configured to suppress out-of-band noise of the circuit.

5. The circuit of claim 4 wherein the plurality of capacitive devices are further configured such that an order of the filter is independent of a quantizer resolution of the sigma-delta modulator.

6. The circuit of claim 5 wherein the quantizer resolution of the sigma-delta modulator is defined by a second plurality of capacitive devices.

7. The circuit of claim 3 wherein a delay element of the plurality of delay elements is adapted to function as a shift register.

8. The circuit of claim 3 wherein a first capacitive device of the plurality of capacitive devices is adapted to receive information stored by a second capacitive device of the plurality of capacitive devices after a time delay controlled by a delay element.

9. The circuit of claim 3 wherein the filter is adapted to operate in a first phase and in a second phase wherein during the first phase a first end of a capacitive device is charged to the reference voltage or discharged to ground and during the second phase the first end of the capacitive device is coupled to the feedback signal.

10. The circuit of claim 1 wherein the circuit is adapted to process the analog signal that is differential and that comprises a first signal out of phase with a second signal.

11. The circuit of claim 1 further comprising a low-pass filter configured to convert the pulse width modulation output signal to the feedback signal.

12. The circuit of claim 11 wherein the circuit is adapted to convert the second pulse density modulation signal from the sigma-delta modulator to the pulse width modulation output signal, and to pass the pulse width modulation output signal through the low-pass filter.

13. The circuit of claim 1 wherein the circuit is adapted to introduce an error signal into the feedback signal by a pulse width modulation of a control loop using the filter and the sigma-delta modulator.

14. The circuit of claim 1 wherein the circuit is adapted to process the analog signal and the feedback signal as differential signals.

15. The circuit of claim 1 wherein the sigma-delta modulator is configured to operate in a first phase and in a second phase,
includes a first plurality of capacitive devices adapted to accumulate charges presented at their nodes during the first phase and during the second phase,
includes a second plurality of capacitive devices having first nodes and second nodes,
is configured to charge the first nodes to a first or a second reference voltage and ground the second nodes during the first phase, and
is configured to couple the first nodes together and the second nodes to an amplifier during the second phase.

16. The circuit of claim 1 wherein the sigma-delta modulator includes a plurality of capacitive devices that defines a quantizer resolution of the sigma-delta modulator.

17. The circuit of claim 1 wherein a quantizer of the sigma-delta modulator has a resolution independent of an order of the filter.

18. The circuit of claim 1 wherein the filter and the sigma-delta modulator are used in a control loop of an amplifier; the control loop adapted to process a signal difference between inputs of the sigma-delta modulator, quantization error of the sigma-delta modulator, quantization error introduced by a pulse-width modulation of the control loop, an output signal of the control loop, the filter, and a low pass filter.

19. The circuit of claim 1 wherein the filter and the sigma-delta modulator are used in a control loop of an amplifier, and an output of the control loop is represented by an equation $$\text{Out}(z) = \frac{H(z) \cdot z^{-N}}{1 + H(z) \cdot B(z) \cdot z^{-N}} \text{In}(z) +$$

$$\frac{H(z) \cdot (1 - z^{-1})^N}{1 + H(z) \cdot B(z) \cdot z^{-N}} q(z) + \frac{1}{1 + H(z) \cdot B(z) \cdot z^{-N}} P(z)$$

where Out(z) represents the output of the control loop, H(z) represents a transfer function corresponding to a digital filter, B(z) represents a transfer function of a low pass filter, In(z) represents an input to the filter, q(z) represents a quantization error of the sigma-delta modulator, P(z) represents a quantization error introduced by a pulse-width modulation of the control loop.

20. The circuit of claim 19 wherein the transfer function corresponding to the digital filter is represented by H(z) and $$H(z) = a_1 z^{-1} + a_2 z^{-2} + \ldots a_n z^{-n}$$

where parameters $a_1$ to $a_n$ correspond to charges of capacitors used in the filter and parameters z correspond to delays experienced by the capacitors.

21. A circuit comprising:
a filter including
a first plurality of capacitive devices;
a sigma-delta modulator including
an amplifier;
a second plurality of capacitive devices; and
a third plurality of capacitive devices;
wherein
during a first phase, the circuit is adapted to
charge capacitive devices of the first plurality of capacitive devices to a first reference voltage or discharge capacitive devices of the first plurality of capacitive devices to ground; and
charge capacitive devices of the second plurality of capacitive devices to a second or a third reference voltage;
during a second phase, the circuit is adapted to
couple the capacitive devices of the first plurality of capacitive devices to a feedback signal and to the amplifier; and
couple the capacitive devices of the second plurality of capacitive devices to the amplifier; and
during the first and the second phases, the circuit is adapted to
accumulate charges presented at nodes of the third plurality of capacitive devices.

22. The circuit of claim 21, wherein the filter is adapted to suppress noise based on a number of the capacitive devices of the first plurality of capacitive devices.

23. The circuit of claim 21 wherein the filter is adapted to control charges acquired by the capacitive devices of the first plurality of capacitive devices based on a received pulse density modulation signal.

24. The circuit of claim 21 wherein the filter further including a plurality of delay elements configured to shift information stored by a first capacitive device of the first plurality of capacitive devices to a second capacitive device of the first plurality of capacitive devices.

25. A circuit comprising:
a filter including:
a set of delay elements;
a first set of capacitive devices;
a second set of capacitive devices;
wherein
a first capacitive device in the first set of capacitive devices corresponds to a second capacitive device in the second set of capacitive devices;
a first delay element of the set of delay elements simultaneously controls the first capacitive device and the second capacitive device; wherein if the first capacitive device is coupled to a reference voltage then the second capacitive device is coupled to ground; and if the first capacitive device is coupled to ground then the second capacitive device is coupled to the reference voltage;
the first set of capacitive devices configured to provide a first signal;
the second set of capacitive devices configured to provide a second signal;
a sigma-delta modulator configured to receive
the first signal and the second signal;
a first feedback and a second feedback signal; and based on the first signal, the second signal, the first feedback signal and the second feedback signal, the sigma-delta modulator is configured to provide a pulse density modulation signal.

26. The circuit of claim 25 wherein a delay element of the set of delay elements is configured to function as a shift register transferring information stored by the first capacitive device to a third capacitive device in the first set of capacitive device and transferring information stored by the second capacitive device to a fourth capacitive device in the second set of capacitive devices after a time delay.

27. The circuit of claim 25 wherein the first signal is opposite out-of-phase with the second signal.

28. The circuit of claim 25 wherein the set of delay elements are controlled by a pulse density modulation signal input to the filter.

29. A circuit comprising:
a filter configured to convert a first pulse density modulation signal to an analog signal; and
a sigma-delta modulator configured to receive the analog signal and a feedback signal, and based on the analog signal and the feedback signal, generate a second pulse density modulation signal, wherein
the circuit is adapted to introduce an error signal into the feedback signal by a pulse width modulation of a control loop using the filter and the sigma-delta modulator.

* * * * *